United States Patent
Campfens

(10) Patent No.: US 7,960,964 B2
(45) Date of Patent: Jun. 14, 2011

(54) METHOD AND SYSTEM FOR DETERMINING A NETWORK STRUCTURE OR LAYOUT OF AT LEAST A PART OF AN ELECTRICITY TRANSPORT NETWORK

(75) Inventor: Franciscus G. M. Campfens, Elst (NL)

(73) Assignee: Nuon Tecno B.V., Duiven (NL)

( * ) Notice: Subject to any disclaimer, the term of this patent is extended or adjusted under 35 U.S.C. 154(b) by 439 days.

(21) Appl. No.: 12/065,394

(22) PCT Filed: Aug. 30, 2006

(86) PCT No.: PCT/NL2006/000437
§ 371 (c)(1),
(2), (4) Date: Sep. 9, 2008

(87) PCT Pub. No.: WO2007/027086
PCT Pub. Date: Mar. 8, 2007

(65) Prior Publication Data
US 2009/0153129 A1   Jun. 18, 2009

(30) Foreign Application Priority Data

Aug. 30, 2005 (NL) .................................... 1029829

(51) Int. Cl.
*G01R 19/00* (2006.01)
*G01V 3/08* (2006.01)

(52) U.S. Cl. ........................... 324/66; 324/326
(58) Field of Classification Search .............. 324/66, 324/67, 326, 323
See application file for complete search history.

(56) References Cited

U.S. PATENT DOCUMENTS

| | | | |
|---|---|---|---|
| 4,734,638 A | 3/1988 | Weber | |
| 5,422,564 A | 6/1995 | Earle | |
| 6,353,320 B1 | 3/2002 | Eslambolchi | |
| 6,980,090 B2 * | 12/2005 | Mollenkopf | 375/258 |
| 6,998,962 B2 * | 2/2006 | Cope et al. | 370/351 |
| 7,606,938 B2 * | 10/2009 | Roese et al. | 709/242 |
| 2003/0151308 A1 | 8/2003 | Thomas | |
| 2005/0017848 A1 | 1/2005 | Flen | |
| 2005/0059392 A1 * | 3/2005 | Lankford | 455/432.1 |

OTHER PUBLICATIONS

International Search Report issued in PCT/NL2006/000437, dated Jan. 16, 2007, 3 pages.
Written Opinion of the International Search Authority in PCT/NL2006/000437, dated Dec. 14, 2007, 7 pages.

* cited by examiner

*Primary Examiner* — Hoai-An D Nguyen
(74) *Attorney, Agent, or Firm* — Pillsbury Winthrop Shaw Pittman LLP

(57) ABSTRACT

A method for determining a network structure or layout of at least a part of an electricity transport network, for instance a low voltage part of this network extending in a city, includes providing a test signal to the network at at least first network location; and verifying whether the test signal, which has been provided to the first network location, reaches at least a second network location, in particular utilizing at least one detector. An embodiment of the invention relates to a system for determining a network structure or layout of at least a part of an electricity transport network.

25 Claims, 2 Drawing Sheets

METHOD AND SYSTEM FOR DETERMINING A NETWORK STRUCTURE OR LAYOUT OF AT LEAST A PART OF AN ELECTRICITY TRANSPORT NETWORK

The invention relates to a method for determining a network structure or layout of at least a part of an electricity transport network, for instance a low voltage part of this network extending in a city.

BACKGROUND

Electricity transport networks are known per se. As a rule, with such networks, a relatively large number of end-users are coupled to one or more power plants via, for instance, various distribution stations, transformer stations and the like.

Especially in cities or other densely built-up areas where relatively many network end-users are present in a relatively small area, it is, as a rule, not known in exactly what manner these end-users are connected to the network. In certain cases, maps may still be available of locations of certain network parts such as intermediate stations, underground electricity transport cables and the like. A detailed network structure, at least layout, of the network especially in the case of an extensive network in a densely built-up area is not available. In addition, with polyphase electricity transport, it is generally, not known how various end-users are connected to the different phases of the network.

SUMMARY

The present invention contemplates obviating the problems mentioned. In particular, the invention contemplates a novel method for accurately determining, for instance, the network structure or layout of at least a part of an electricity transport network.

According to one aspect of the invention, the method is characterized to this end in that it comprises:
  providing a test signal to the network at at least a first network location; and
  verifying whether said test signal, which has been provided to the network location, reaches at least a second network location, utilizing, in particular, at least one detector.

In this manner, the network structure/layout of at least a part of an electricity transport network may be determined in a relatively simple and accurate manner, preferably during normal use of the network so that supply of electricity to end-users can continue normally.

The first network location mentioned may be located in or near a distribution station of the network, in or near for instance a transformer station designed for converting high voltage or medium voltage to low voltage. Further, this second network location can be located in or near, for instance, an end-user location, such as a house or the like, in particular in or near, for instance, an electricity meter that registers the electricity consumption of the end-user The first network location may be hierarchically higher in the network than the second network location. Thus, in an efficient manner, it can be determined for a relatively large number of different second network locations, whether these locations are connected to this first location.

Conversely, such a second network location may be located in or near a distribution station of the network and the first network location may be located in or near the end-user location. In such a case, the second network location may be hierarchically higher in the network than the first network location. This first network location may then be located in or near, for instance, an end-user location, such as a house or the like, in particular in or near an electricity meter that registers the electricity consumption of the end-user.

Further, during use, test signals can be sent in different directions through the electricity network for determining the network structure or layout of the network. Test signals may be sent both from one or more network locations situated hierarchically higher, and from network locations situated hierarchically lower. Further, both in network locations situated hierarchically higher and in network locations situated hierarchically lower, it can de determined whether test signals reach the respective locations and, optionally, for instance, which test signals are involved.

Further, results of the method, such as results of test signal detections performed by a detector or detectors, may be used for recording, for instance in a memory and/or in writing and/or cartographically, which second network location is coupled via the network to which first network location.

It is furthermore advantageous, according to an aspect of the invention, when the test signal is provided with specific information. This information can comprise various data and relate to, for instance, the first network location where the respective test signal is provided to the network. This information can comprise, for instance, data about identification information, a position, and/or address information of the first location. The information can further comprise a unique code. In this manner, after reception of a test signal at a second location, it can simply be determined at a second location from which first location the test signal originates.

One aspect of the invention further provides a system for determining a network structure or layout of at least a part of an electricity transport network, for instance a low voltage part of this network extending in a city, comprising:
  at least one transmitter designed for inputting at least one test signal into the network at or near at least a first network location; and
  at least one detector designed for detecting the presence of this test signal at at least a second network location of the network, the system being particularly suitable for use in a method according to any one of the preceding claims. Through the use of this system, the above-mentioned advantages can be obtained.

One aspect of the invention further provides a data carrier, for instance a map, at least provided with data obtained with a method according to the invention. The network structure/layout of the network can for instance be accurately indicated on the map. These data may comprise digital and/or analogue data.

The invention further provides a transmitter of a system according to the invention, and a receiver of a system according to the invention. This transmitter may form part of a data collecting apparatus or distribution station, or of an electricity meter of an end-user, or be designed differently. The receiver may form part of a data collecting apparatus or distribution station, or of an electricity meter of an end-user, or be designed differently, respectively.

BRIEF DESCRIPTION OF THE DRAWINGS

Further elaborations of the invention are described in the subclaims. Presently, the invention will be clarified on the basis of a non-limitative exemplary embodiment and the drawing. In the drawing:

DETAILED DESCRIPTION

Figure 1:
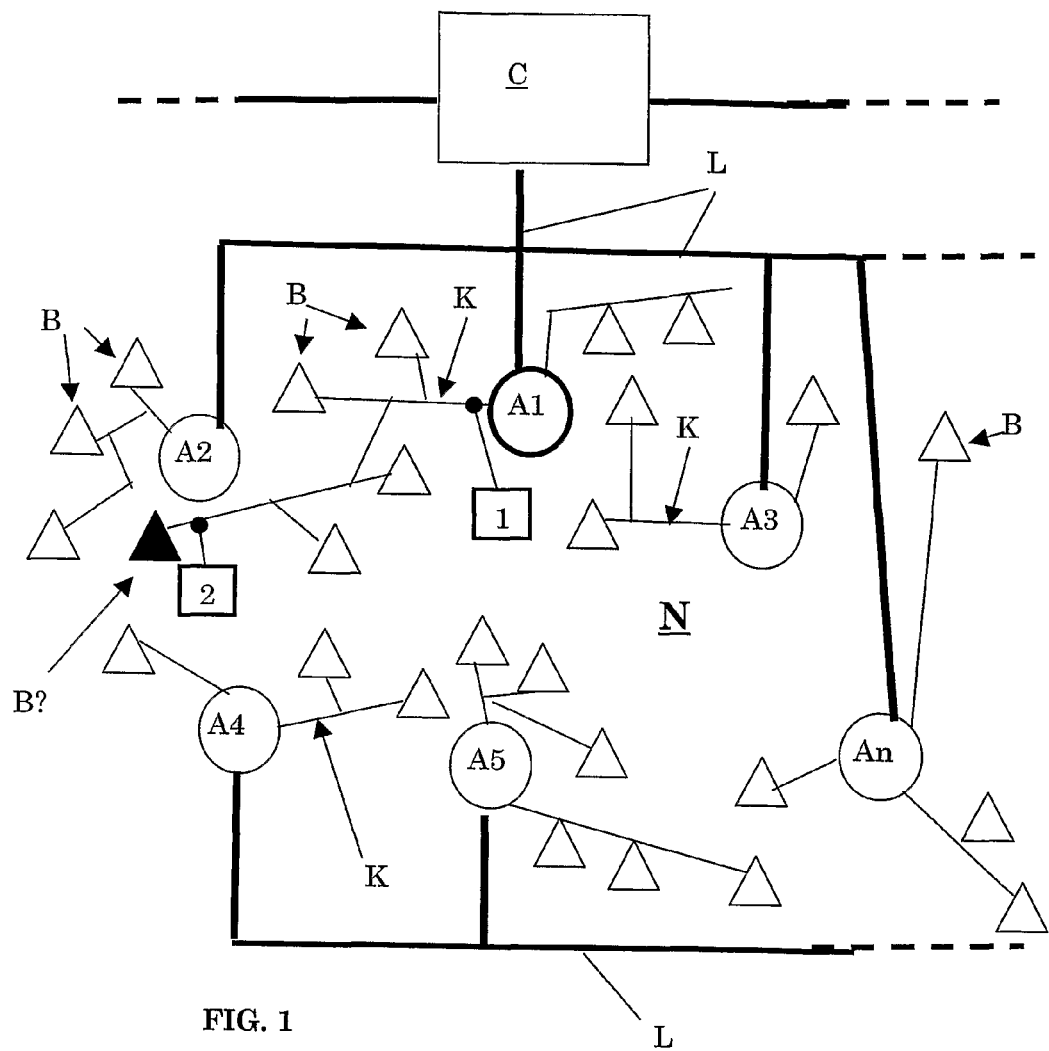
FIG. 1 shows a schematically represented exemplary embodiment of the invention.

FIG. 1 schematically shows a part of an electricity transport network N. The network part comprises, for instance, a low voltage part of the electricity transport network extending in a city. The wording "low voltage" can be understood to mean, for instance, an alternating voltage in the range of approximately 100-1,000 V, for instance an alternating voltage of approximately 110 Volt, or approximately 220V. The network part N can be designed for, for instance, supplying a polyphase power, in particular a three-phase power to end-users.

The exemplary embodiment is provided with a number of end-user locations B, schematically indicated with triangles, of end users. The end-user locations B, at least end-users, are connected, via low voltage electricity transport cables K, to a number of distribution stations A (in particular A1-An) schematically indicated with circles. The distribution stations A may be coupled to one or more main distribution stations and/or power stations C, by means of, for instance, medium voltage or high voltage conductors L. The distribution stations A are designed for, for instance, distributing electricity originating from network parts situated hierarchically higher, such as the main distribution stations and/or power stations C, over network elements situated hierarchically lower, for instance the end-users. The distribution stations B can further comprise transformer kiosks or the like, and are designed for converting high or medium voltage into the low voltage mentioned.

Figure 2:
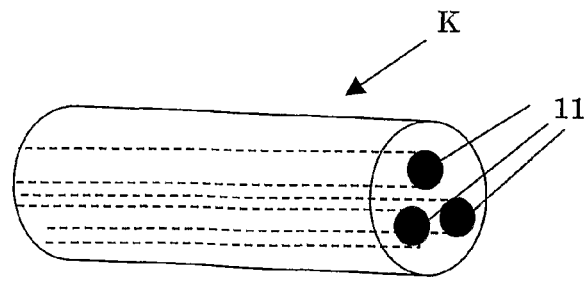
FIG. 2 shows a perspective side view of a part of a three-phase power cable of the exemplary embodiment.

FIG. 2 schematically shows a part of a design of a low voltage cable K, which, in the exemplary embodiment, is provided in particular with three parallel extending cores 11 for transporting, for instance, three-phase power.

The network part N represented in FIG. 1 illustrates the situation that may occur in a densely populated or densely built-up area with many end-users in a relatively small area. In that case, certain end-user locations B can be located for instance at a relatively great distance from the associated, hierarchically higher distribution station A. An end-user location may further be located closer to a different distribution station A, not associated with the respective end-user. The location of such an end-user which is connected to a first distribution station A1 but is located closer to a second distribution station A2, is indicated in FIG. 1 with a black triangle B?

FIG. 1 further schematically shows a system for determining the network structure/layout of at least a part of the electricity transport network N. The system comprises one or more transmitters 1, one of which is schematically drawn. In the exemplary embodiment, each transmitter 1 is designed for inputting at least one test signal to the network N at or near at least a first network location A, for instance at or near a concentrator known per se of a distribution station A. To this end, the transmitter 1 can be designed in various manners. The transmitter 1 may be brought in electric connection to a respective transport cable K, or data collecting apparatus or data collecting part, for transmitting the test signal to the respective network part N. In an advantageous manner, the transmitter 1 can be designed for providing the network with the signal at the location B, utilizing inductive and/or capacitive coupling. In FIG. 1, the transmitter 1 is connected to a network branch of said first distribution station A1.

The system is further provided with one or more detectors 2, one of which is schematically represented. In FIG. 1, this detector is arranged adjacent the location B? of the end-user indicated with the black triangle, which is located adjacent the second distribution station A2. The detector 2 is designed for detecting the presence of the test signal at the respective second network location B?. The second network location B? is, for instance, a location at or adjacent an electricity meter known per se (not represented), coupled to the network, and which registers the electricity consumption of the end-user. The detector 2 can, for instance, be brought into electric connection to a network part adjacent or of this end-user location B?. The detector 2 can further be designed for, for instance, receiving the test signal by means of inductive and/or capacitive coupling from one or more power conductors of the network, at or nears the end-user location B?.

Preferably, the transmitter 1 and detector 2 can each be designed to be relatively lightweight and portable. As a result, the transmitters 1 can easily be moved between various distribution stations A, and detectors 2 can easily be moved between different end-user locations B for performing/carrying out network structure determination.

According to one aspect of the invention, the transmitter 1 and detector 2 are designed for utilizing one or more low frequency test signals, for instance one or more signals with a frequency which is in the range of approximately 50 or 60 Hz to approximately 10 kHz, in particular a frequency higher than 50 Hz and lower than 9 kHz. Such signals can be transmitted well via an electricity transport network while, for instance, crosstalk of test signals between network part that may be located closely together can be prevented. Further, such low-frequency signals can for instance be used as carrier wave for exchanging information with network locations or network elements situated hierarchically lower. Each test signal may comprise various "pilot tones" for instance an alternating voltage signal with a particular suitable wave shape, or information modulated on a particular carrier wave or carrier waves, or a different suitable signal.

It is further advantageous when the transmitter 1 is designed for providing the test signal with information, while the detector 2 is preferably designed for making available, storing and/or representing the information, at or near the second network location B, in particular during and/or after reception of the test signal mentioned. Such information can comprise various data, as is already described hereinabove. It will be clear to the skilled person that the transmitter 1 and receiver 2 can be designed in various manners for utilizing test signals containing information. The transmitter 1 can be provided with, for instance, input means such as a keyboard, for inputting such information, and the receiver 2 may be provided with output means such as a display, for outputting the information. Such information can further, for instance, be pre-programmed in the transmitter 1.

During use of the system, one or more test signals can be provided by one or more transmitters 1 to, for instance, a first network location A, in particular a distribution station A. Each signal may be transmitted continuously, periodically or otherwise. As already stated, coupling between a transmitter 1 and the network can be carried out in various manners, by means of, for instance, inductive and/or capacitive coupling. Here, it is preferred that the network part N remains in operation for supplying electricity to the end-users.

The test signal may be provided with information such as data or identification information relative to the distribution station A, an address, name and/or location of this distribution station A, and/or data relating to the location of the transmitter, for instance GPS (Global Positioning System) data, coordinates or the like. The information may comprise a unique code, for instance a code related to the respective transmitter 1. The test signal may be provided with such information continuously, periodically or otherwise.

Suitable test signals may be inputted successively or simultaneously to the network N by transmitters 1 at different distribution stations A, for instance different test signals with different frequencies, and/or different test signals that are provided with different information for distinguishing one test signal from another. As stated, the test signals may be low frequency signals, for instance in the above-mentioned frequency ranges. The test signal may further comprise a digital or analogue signal.

During use, further, one or more detectors 2 are provided at one or more second network locations B, for instance end-user locations. Each detector 2 can be used for verifying whether the test signal mentioned that has been provided to a first network location, actually reaches a specific second network location B, and/or for interpreting which test signal is involved if different test signals are used. A detector 2 can thus make available, store or represent the information provided in a test signal especially during and/or after reception of this test signal, at least if the detector 2 is designed thereto.

In one elaboration of the invention, one or more detectors 2 are provided at a large number of second network locations B for detecting whether the test signal mentioned and provided to one first network location A reaches these second network locations B via the network part N. On the other hand, one detector 2 may be used for measuring at different network locations whether a test signal reaches the network location B and/or which test signal originating from which first network location A or respective transmitter 1 is involved. A detector 2 can further form part of, for instance, an electricity meter of this end user.

Preferably, results of test signal detections performed by the detector(s) 2 are used for recording, for instance in a memory and/or in writing and/or cartographically, which second network location B is coupled to which network location A, via the network part N.

Figure 3:
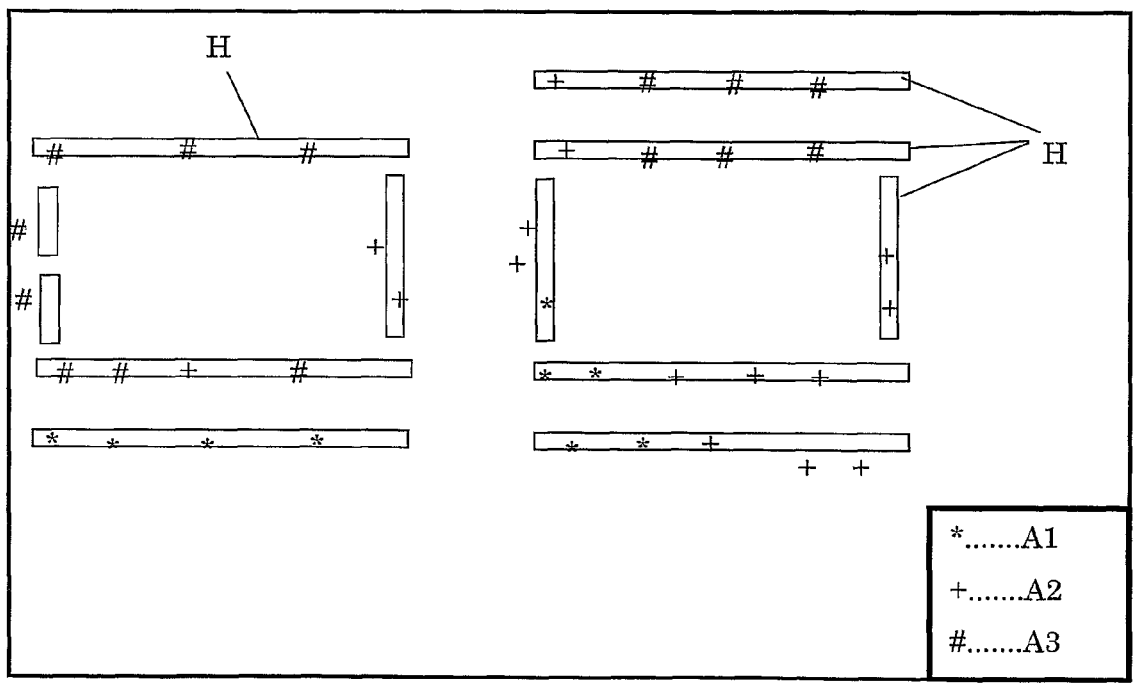
FIG. 3 schematically shows an exemplary embodiment of a data carrier.

FIG. 3 schematically shows a plan of an area provided with blocks of houses H comprising various end-user locations, it being indicated for each house, with symbols *, +, #, to which distribution station A1, A2, A3 this house is connected. This information, provided on the plan, and relating to the network structure/layout of the electricity network is, for instance, obtained utilizing an above described system and method according to the invention.

As stated, the network part N may be provided with polyphase power conductors K comprising, for instance, different cores 11 for transporting different phases (see FIG. 2). In that case, at a first location A, different test signals may be simultaneously provided to the different cores 11 of the power conductors by, for instance, one or more suitable transmitters 1. Alternatively, a test signal may be successively provided to the different cores 11.

Then, at a second location B, utilizing one or more suitable receivers 2 and the test signals sent by the transmitter(s), it can be verified to which of the different phase(s), originating from a first location A, a respective end-user is connected. Such phase information can, for instance, be stored, represented on a map and/or the like. Furthermore, such phase information may be utilized for verifying whether the supply of the different phases is distributed proportionally over a number of end-users. When the distribution is not proportional, when, for instance, a relatively large part of the users is connected to the same phase of the network or a network branch, the distribution may be adjusted in a simple manner by connecting end-users to a different phase. In this manner, overload of a part of the network may be prevented.

It is self-evident that the invention is not limited to the exemplary embodiment described. Various modifications are possible within the framework of the invention as set forth in the following claims.

For instance, a transmitter and receiver can each be designed in different manners. Further, for instance a number of transmitter/measuring modules can be provided, with each module comprising both a transmitter part for inputting signals to an electricity network, and a receiver part for receiving signals from the network.

In this manner, in the exemplary embodiment, second network locations are specifically associated with end-user locations. However, the locations of other parts or elements of the network, for instance network cables, cable parts situated hierarchically relatively low or the like also fall within the wording "second network locations".

Further, the wording "network structure" can be interpreted broadly and mean, for instance, topography or layout, or the like.

The invention claimed is:

1. A method for determining a network structure or layout of at least a part of an electricity transport network, the network comprising a number of end-user locations being coupled via electricity transport cables to a plurality of transformer stations, the method comprising:
   providing a test signal to the network at at least a first network location; and
   verifying whether said test signal, which has been provided to the first network location, reaches at least a second network location, to determine which second network locations are connected to which first network locations thereby determining which end user locations are connected to which transformer stations of the electricity transport network, wherein said first network location or second network location is located in or near a transformer station of the network, while said second network location or first network location, respectively, is located in or near an end-user location.

2. A method according to claim 1, wherein the second network location is located in or near an electricity meter that is configured to register the electricity consumption of an end-user.

3. A method according to claim 1, wherein one or more detectors are provided at a plurality of second network locations to detect whether said test signal, provided to a first network location, reaches the second network locations via the network.

4. A method according to claim 1, wherein results of test signal detections performed at said second network location are recorded, in a memory and/or in writing and/or cartographically, while said results are preferably utilized for recording which second network location is coupled, via the network, to which first network location.

5. A method according to claim 1, wherein said test signal is a low frequency signal with a frequency in the range of approximately 50 or 60 Hz to approximately 10 kHz.

6. A method according to claim 1, wherein said test signal is provided to one or more power conductors of said network using inductive and/or capacitive coupling.

7. A method according to claim 1, wherein said test signal is provided with information, said information being preferably made available, stored and/or represented during and/or after reception of said test signal.

8. A method according to claim 7, wherein said information relates to the first location network location where the respective test signal is provided to the network, while said information comprises data about identification information, a position and/or address information of this first location.

9. A method according claim 1, wherein said network part is provided with polyphase power conductors, comprising different cores configured to transport different phases, wherein:
   one test signal is successively provided to different cores of the power conductors; or
   more test signals are provided simultaneously to different cores of the power conductors.

10. A method according to claim 1, wherein different test signals of different frequencies and/or signals provided with different information, are provided to different first network locations.

11. A method according to claim 1, wherein said part of the electricity network is in use configured to supply electricity to end-users during provision of said test signal to this network part.

12. A method according to claim 1, wherein the transformer station is configured to convert high voltage or medium voltage to low voltage.

13. A method according to claim 5, wherein the frequency is higher than 50 Hz and lower than 9 kHz.

14. A method according to claim 1, wherein the electricity transport network is a low voltage part of a network extending in a city.

15. A system for determining a network structure or layout of at least a part of an electricity transport network, the network comprising a plurality of end-user locations being coupled via electricity transport cables to a number of transformer stations, the system comprising:
   at least one transmitter configured to input at least one test signal to the network at or near at least first network location; and
   at least one detector configured to detect the presence of said test signal at at least a second network location of the network so as to determine which end user locations are connected to which transformer stations of the electricity transport network.

16. A system according to claim 15, wherein said transmitter and/or detector are each of portable design.

17. A system according to claim 15, wherein said transmitter and detector are configured to utilize one or more low frequency test signals in the range of approximately 50 or 60 Hz to approximately 10 kHz.

18. A system according to claim 15, wherein said transmitter is configured to provide said test signal using inductive and/or capacitive coupling to one or more power conductors of said network.

19. A system according to claim 15, wherein said detector is configured to receive said test signal using inductive and/or capacitive coupling from one or more power conductors of said network.

20. A system according to claim 15, wherein said transmitter is configured to provide said test signal with information, while said detector is designed for making available, storing and/or representing said information during and/or after reception of said test signal.

21. Use of a system according to claim 15, for determining which end-user locations or transformer stations, are connected to which transformer stations or end-user locations, respectively, of the electricity transport network.

22. A system according to claim 15, wherein the transmitter is part of a distribution station, and wherein the detector is part of an electricity meter of an end-user.

23. A system according to claim 17, wherein the frequency is higher than 50 Hz and lower than 9 kHz.

24. A system according to claim 15, wherein the transmitter is part of an electricity meter of an end-user, and wherein the detector is part of a distribution station.

25. A system according to claim 15, wherein the electricity transport network is a low voltage part of a network extending in a city.

* * * * *